US009461562B1

(12) United States Patent
Johal et al.

(10) Patent No.: US 9,461,562 B1
(45) Date of Patent: Oct. 4, 2016

(54) LOW VOLTAGE DETECTOR

(75) Inventors: Jaskarn Singh Johal, Mukilteo, WA (US); Andrew C. Page, Kirkland, WA (US); Timothy John Williams, Bellevue, WA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 1025 days.

(21) Appl. No.: 13/427,853

(22) Filed: Mar. 22, 2012

Related U.S. Application Data

(60) Provisional application No. 61/602,793, filed on Feb. 24, 2012.

(51) Int. Cl.
| | | |
|---|---|---|
| *G01R 19/00* | (2006.01) | |
| *H02M 1/00* | (2006.01) | |
| *H02M 7/00* | (2006.01) | |
| *H02M 11/00* | (2006.01) | |
| *H02M 3/00* | (2006.01) | |
| *H02M 5/00* | (2006.01) | |

(52) U.S. Cl.
CPC .............. *H02M 11/00* (2013.01); *H02M 7/00* (2013.01); *H02M 3/00* (2013.01); *H02M 5/00* (2013.01)

(58) Field of Classification Search
CPC ........ H02M 11/00; H02M 7/00; H02M 3/00; H02M 5/00
USPC ..................................... 324/705; 363/49, 61
See application file for complete search history.

(56) References Cited

U.S. PATENT DOCUMENTS

| | | | |
|---|---|---|---|
| 5,642,062 A * | 6/1997 | Kawakami | ...................... 327/66 |
| 7,225,088 B2 | 5/2007 | Smit et al. | |
| 7,274,999 B1 * | 9/2007 | Saether | .......................... 702/58 |
| 7,589,568 B2 | 9/2009 | Steedman et al. | |
| 7,693,669 B2 | 4/2010 | Saether | |
| 7,873,854 B2 | 1/2011 | Westwick et al. | |
| 7,908,508 B2 | 3/2011 | Kernahan et al. | |
| 2004/0239413 A1 | 12/2004 | Gubbins | |
| 2006/0119401 A1 * | 6/2006 | Kitagawa et al. | .............. 327/74 |
| 2009/0268488 A1 * | 10/2009 | Fujii | ...................... H02M 1/32 363/49 |
| 2011/0185212 A1 | 7/2011 | Dao et al. | |
| 2012/0206947 A1 * | 8/2012 | Haight | .................. H02M 7/217 363/84 |

FOREIGN PATENT DOCUMENTS

WO      2011045677 A      4/2011

OTHER PUBLICATIONS

Claudio Canizares, Antonio de Souza and Victor Quiritana_Comparison of Performance Indices for Detection of Proximity to Voltage Collapse_Dated Aug. 1996_10 pages.
Search Report for U.S. Appl. No. 13/427,853, Dated Mar. 2012, 12 pages.
Venkataramana Ajjarapu and Colin Christy_The Continuation Power Flow: A Tool for Steady State Voltage Stability Analysis_ Dated Feb. 1992_8 pages.

* cited by examiner

*Primary Examiner* — Farhana Hoque

(57) ABSTRACT

An apparatus includes a voltage monitoring device to generate a brownout indication signal in response to a change in a power supply voltage. The apparatus also includes a mode control device to control a temporal response of the voltage monitoring device to the change in the power supply voltage based, at least in part, on a voltage level of the power supply voltage.

16 Claims, 10 Drawing Sheets

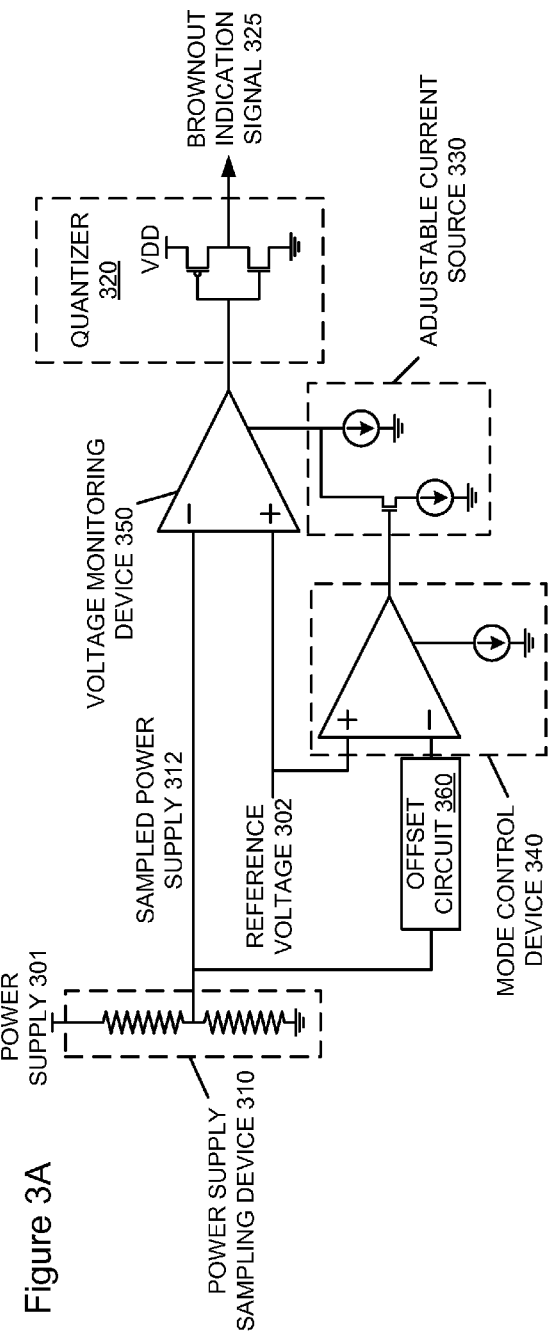
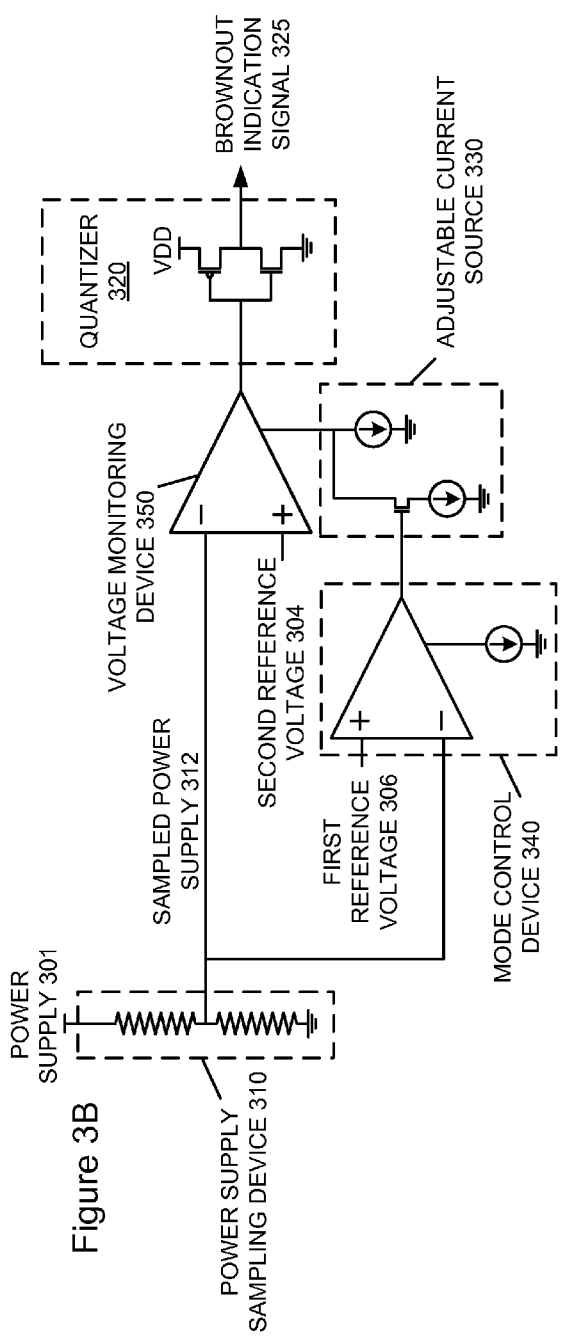
Figure 3A
Figure 3B

LOW VOLTAGE DETECTOR

CROSS-REFERENCE TO RELATED APPLICATIONS

This application claims priority to U.S. Provisional Patent Application No. 61/602,793, filed Feb. 24, 2012.

TECHNICAL FIELD

This disclosure relates generally to electronic systems, and, more particularly, to low voltage detectors.

BACKGROUND

Many electronic systems include brownout detection circuits to detect brownout events, for example, when a power supply may be failing. The brownout detection circuits can notify the electronic systems of the brownout events, which may allow the electronic systems to store states of logic circuitry and retention registers prior to a loss of power from the power supply.

The brownout detection circuits can be configured to either notify the electronic systems of the brownout event quickly with a high power consumption or operate slowly with a low power consumption. As the desire for reduced power consumption products increases, many system designers tradeoff response time for power consumption often leaving the electronic systems with little to no time to retain logic state and registers values.

DESCRIPTION OF THE DRAWINGS

FIGS. 3A-3D are block diagram examples of a low voltage detection system.

DETAILED DESCRIPTION

An electronic system can include a low voltage detection system to quickly respond to brownout events, for example, a drop or change in a power supply voltage, but to also operate with low power consumption during normal operation. The low voltage detection system can include a voltage monitoring device to generate a brownout indication signal in response to detection of a brownout event. The low voltage detection system can include a mode control device to control a mode of operation of the voltage monitoring device. For example, the mode control device can set the voltage monitoring device in a low power mode during normal operation of a power supply, which would have a relatively slow response time. The mode control device can detect a potential onset of a brownout event and switch the voltage monitoring device to a fast response mode, which can allow the voltage monitoring device to quickly respond to the brownout event. Embodiments are shown and described below in greater detail.

Figure 1:
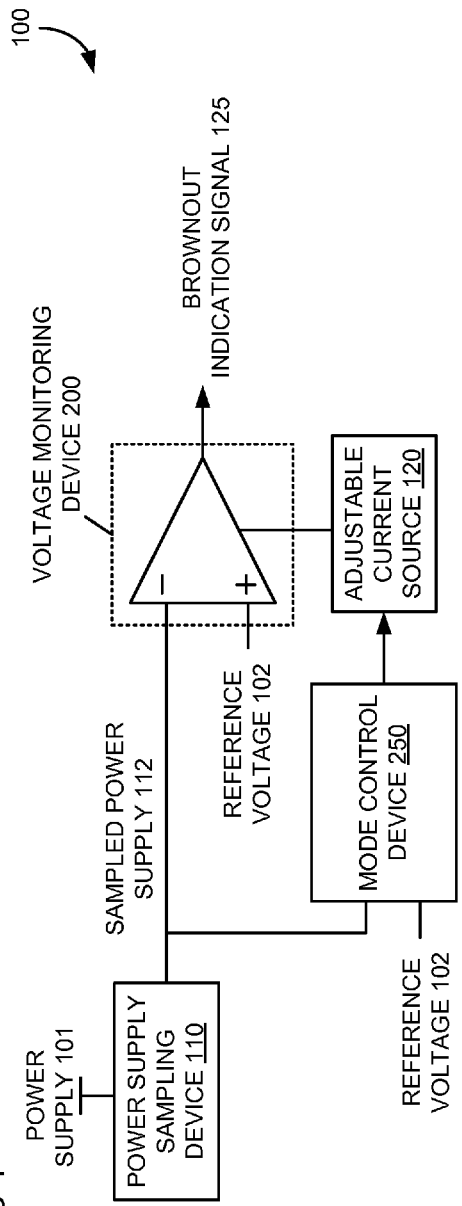
FIG. 1 is a block diagram example of a low voltage detections system.

FIG. 1 is a block diagram example of a low voltage detection system 100. Referring to FIG. 1, the low voltage detection system 100 can include a voltage monitoring device 200 to detect brownout events for a power supply 101 and issue a brownout indication signal 125 in response to the brownout events. The voltage monitoring device 200 can output the brownout indication signal 125 to an electronic device, for example, as a reset signal, which can prompt the electronic device to preserve data, such as logic states and values in retention registers that may be affected by the brownout event.

The low voltage detection system 100 can include an adjustable current source 120 to power the voltage monitoring device 200. The magnitude of the current through the voltage monitoring device 200 can control a temporal response of the voltage monitoring device 200 to the onset of a brownout event. For example, the higher the current by the adjustable current source 120, the faster the temporal response to the onset of the brownout event by the voltage monitoring device 200.

The low voltage detection system 100 can include a mode control device 250 to control the magnitude of the current generated by the adjustable current source 120. Since the magnitude of the current generated by the adjustable current source 120 corresponds to the temporal response of the voltage monitoring device 200, the mode control device 250 can control the temporal response of the voltage monitoring device 200 through the control of the adjustable current source 120. The mode control device 250 can determine the magnitude of the current for the adjustable current source 120 to generate, for example, based on the power supply 101, such as a sampled power supply 112, and a reference voltage, such as the reference voltage 102. In some embodiments, the mode control device 250 can adjust the magnitude of the current for the adjustable current source 120 to generate after the sampled version of the power supply 101 drops below a first threshold voltage level.

The low voltage detection system 100 can include a power sampling device 110 to sample the power supply 101 to generate a sampled power supply 112. The voltage monitoring device 200 can monitor the sampled power supply 112 and detect a drop in a voltage level of the sampled power supply 112, which may annunciate an onset of a brownout event. The voltage monitoring device 200 can generate the brownout indication signal 125, for example, when the power supply 101 drops below a second threshold voltage level. In some embodiments, the voltage monitoring device 200 can include a comparator to compare the sampled power supply 112 with the reference voltage 102, and generate the brownout indication signal 125 based on the comparison of the sampled power supply 112 and the reference voltage 102.

The low voltage detection system 100 can operate in a low power mode, for example, when the power supply 101 is within a normal operating range. In the low power mode, the mode control device 250 can direct the adjustable current source 120 to generate a small amount of current to power the voltage monitoring device 200. The voltage monitoring device 200 can output a low brownout indication signal 125, indicating that there is no current brownout event, or may not output any signal when there is no current brownout event in the low power mode.

The mode control device 250 can transition the low voltage detection system 100 from the low power mode to a fast response mode in response to a change in the power supply 101, for example, when the power supply 101 drops below the first threshold voltage level. The mode control device 250 can direct the adjustable current source 120 to generate an increased current, which can cause the voltage monitoring device 200 to have an increased temporal response to any change in the power supply 101 that falls below the second threshold voltage level. In some embodiments, the first threshold voltage level is higher than the second threshold voltage level utilized by the voltage monitoring device 200 to generate the brownout indication signal 125, which can allow the mode control device 250 to prompt the transition to the fast response mode prior to the power supply 101 dropping below the second threshold voltage level.

Although FIG. 1 shows the mode control device 250 having the ability to control a temporal response of the voltage monitoring device 200, in some embodiments, the mode control device 250 can control an accuracy of the voltage monitoring device 200. For example, the mode control device 250 can set the voltage monitoring device 200 in a high accuracy mode or a low accuracy mode based on the power supply 101, such as a sampled power supply 112.

Figure 2:
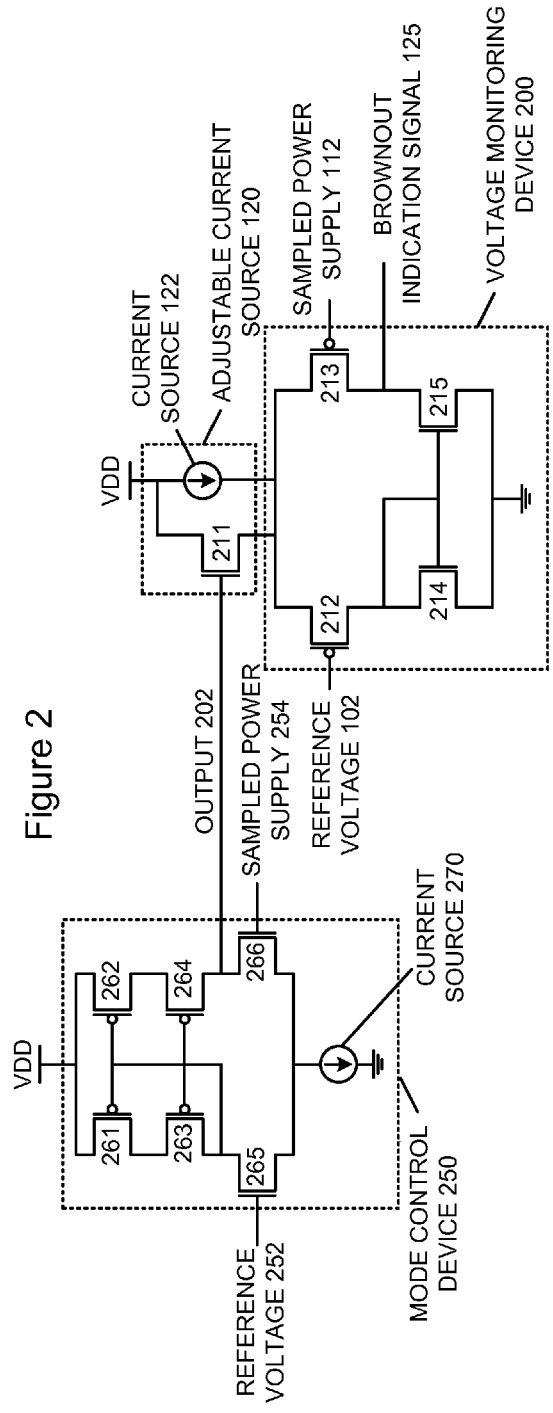
FIG. 2 is a block diagram example of the voltage monitoring device and the mode control device of the low voltage detection system shown in FIG. 1.

FIG. 2 is a block diagram example of the voltage monitoring device 200 and the mode control device 250 of the low voltage detection system 100 shown in FIG. 1. Referring to FIG. 2, the voltage monitoring device 200 can be an operational transconductance amplifier (OTA) configured in an open-loop as a continuous-time comparator. The voltage monitoring device 200 can include a pair of p-type metal-oxide-semiconductor (PMOS) transistors 212 and 213 with gates configured to receive the reference voltage 102 and the sampled power supply 112, respectively.

The sources of the PMOS transistors 212 and 213 are configured to receive current from the adjustable current source 120. In some embodiments, the adjustable current source 120 can include a current source 122 to provide a first current to the voltage monitoring device 200. The adjustable current source 120 can include a n-type metal-oxide-semiconductor (NMOS) transistor 211 to selectably provide a second current to the voltage monitoring device 200.

The voltage monitoring device 200 can be set in a low power mode when the NMOS transistor 211 is turned off, for example, when an output 202 is set to low, allowing the first current from the current source 122 to reach the voltage monitoring device 200. The voltage monitoring device 200 can be set in a fast response mode when the NMOS transistor 211 is turned on, for example, when the output 202 is set to high, allowing both the first and second currents to reach the voltage monitoring device 200.

The drains of the PMOS transistors 212 and 213 are configured to couple with drains of NMOS transistors 214 and 215, respectively. The NMOS transistors 214 and 215 can be configured as a current mirror, with their gates tied together with the drain of NMOS transistor 214 and their sources coupled to a ground. The voltage monitoring device 200 can include an output coupled between the drains of PMOS transistor 213 and NMOS transistor 215 to output the brownout indication signal 125.

The mode control device 250 can be configured as a single stage amplifier. The mode control device 250 can include a pair of NMOS transistors 265 and 266 with gates configured to receive a reference voltage 252 and a sampled power supply 254, respectively. In some embodiments, the reference voltage 252 can have a same or different voltage level as reference voltage 102, and/or sampled power supply 254 can have a same or different voltage level as sampled power supply 112. The difference between the reference voltage 252 and the sampled power supply 254 can determine when the power supply 101 drops below or exceed the first threshold voltage level in order to change an operational mode of the voltage monitoring device 200.

The sources of the NMOS transistors 265 and 266 are coupled to a current source 270, which can draw current through the NMOS transistors 265 and 266 to a ground. The drains of the NMOS transistors 265 and 266 are configured to couple with drains of PMOS transistors 263 and 264, respectively. The PMOS transistors 263 and 264 can be configured as a current mirror, with additional PMOS transistors 261 and 262, respectively. The mode control device 250 can include an output 202 coupled between the drains of PMOS transistor 264 and NMOS transistor 266. The output 202 can prompt the adjustable current source 120 to selectively activate the NMOS transistor 211 and vary the current provided to the voltage monitoring device 200.

Figure 3C:
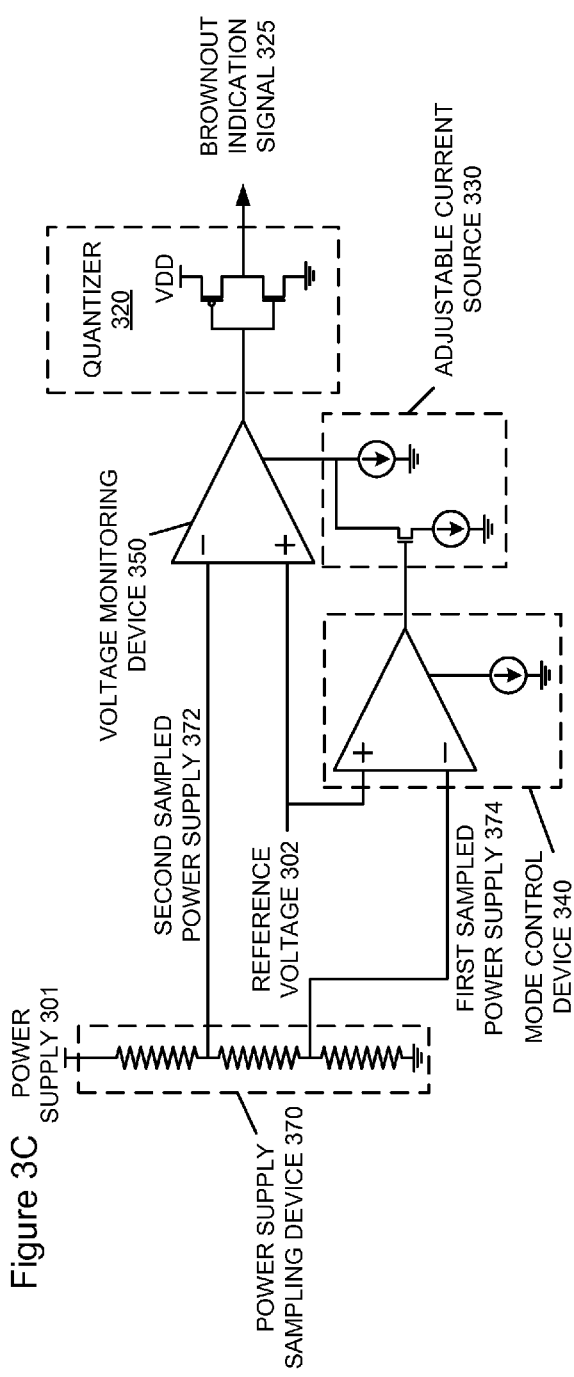

FIGS. 3A-3D are block diagram examples of low voltage detection systems. Referring to FIG. 3A, a low voltage detection system can include a voltage monitoring device 350 to detect brownout events and issue a brownout indication signal 325 in response to the brownout events. The voltage monitoring device 350 can output the brownout indication signal 325 to an electronic device, for example, as a reset signal, which can prompt the electronic device to preserve data, such as logic states and values in retention registers that may be affected by the brownout event.

The low voltage detection system can include a power sampling device 310 to sample a power supply 301 to generate a sampled power supply 312. The power sampling device 310 can be a resistor ladder, for example, having multiple resistors coupled in series. In some embodiments, the sampled power supply 312 can correspond to a voltage level at a connection point between the multiple resistors.

The low voltage detection system can include an adjustable current source 330 to power the voltage monitoring device 350. The magnitude of the current through the voltage monitoring device 350 can control a temporal response of the voltage monitoring device 350 to the onset of a brownout event. For example, the higher the current generated by the adjustable current source 330, the faster the temporal response to the onset of the brownout event by the voltage monitoring device 350.

The low voltage detection system can include a mode control device 340 to control a magnitude of the current generated by the adjustable current source 330. Since the magnitude of the current generated by the adjustable current source 330 corresponds to the temporal response of the voltage monitoring device 350, the mode control device 340 can control the voltage monitoring device 350 through the control of the adjustable current source 330. The mode control device 340 can determine the magnitude of the current for the adjustable current source 330 to generate, for example, based on the reference voltage 302 and a version of the sampled power supply 312 from an offset circuit 360. The offset circuit 360 can adjust a voltage magnitude of the sampled power supply 312 and provide the adjusted version of the sampled power supply 312 to the mode control device 340.

The mode control device 340 can control the adjustable current source 330 after the version of the sampled power supply 312 indicates the power supply 301 reaches or drops below a first threshold voltage level. The offset circuit 360 can adjust the sampled power supply 312 to allow the mode control device 340 the ability to determine when the power supply 301 reaches or drops below the first threshold voltage level based on a comparison of the adjusted version of the sampled power supply 312 to the reference voltage 302.

The voltage monitoring device 350 can detect a drop in a voltage level of the sampled power supply 312, which can indicate an onset of a brownout event. The voltage monitoring device 350 can generate the brownout indication signal 325, for example, after the power supply 301 drops below a second threshold voltage level. In some embodiments, the first threshold voltage level can be higher than the second threshold voltage level utilized by the voltage monitoring device 350 to generate the brownout indication signal 325, which can allow the mode control device 340 to prompt the transition to a fast response mode prior to the sampled power supply 312 dropping below the second threshold voltage level. In some embodiments, the voltage monitoring device 350 can include a comparator to compare the sampled power supply 312 with the reference voltage 302, and generate the brownout indication signal 325 based on the comparison of the sampled power supply 312 and the reference voltage 302.

The low voltage detection system can include a quantizer 320 to convert the brownout indication signal into a discrete-voltage signal, which can output the brownout indication signal 325, for example, as a reset signal with a high state and a low state. In some embodiments, the quantizer 320 can include a complementary metal-oxide-semiconductor (CMOS) logic circuit including a PMOS transistor having a common gate and a common drain with an NMOS transistor. The common drain of the transistors can correspond to an output for the brownout indication signal 325.

Referring to FIG. 3B, the low voltage detection system shown in FIG. 3B can be similar to the low voltage detection system shown in FIG. 3A and described above, with the following differences. The low voltage detection system shown in FIG. 3B can be configured to allow the mode control device 340 to detect when the power supply 301 reaches or exceeds the first threshold voltage level and allow the voltage monitoring device 350 to detect when the power supply 301 reaches or exceeds the second threshold voltage level based on different reference voltages. The voltage monitoring device 350 can receive a second reference voltage 304 to compare with the sampled power supply 312. When the comparison reveals that the sampled power supply 312 drops below the second reference voltage 304, the voltage monitoring device 350 can generate the brownout indication signal 325 to indicate the power supply 301 may be undergoing or will undergo a brownout event.

The mode control device 340 can receive a first reference voltage 306 to compare with the sampled power supply 312. The mode control device 340 can set an operational mode of the voltage monitoring device 350 based on the comparison of the first reference voltage 306 and the sampled power supply 312. The operational mode can set or adjust a temporal response of the voltage monitoring device 350 to a change in the sampled power supply 312. In some embodiments, the first reference voltage 306 can have a voltage level that is higher than the second reference voltage 304, allowing the mode control device 340 to set the voltage monitoring device 350 in an operational mode having a fast response time to a brownout event.

Referring to FIG. 3C, the low voltage detection system shown in FIG. 3C can be similar to the low voltage detection system shown in FIGS. 3A-3B and described above, with the following differences. The low voltage detection system shown in FIG. 3C can be configured to allow the mode control device 340 to detect when the power supply 301 reaches or exceeds the first threshold voltage level and allow the voltage monitoring device 350 to detect when the power supply 301 reaches or exceeds the second threshold voltage level based on different sampled power supplies. The voltage monitoring device 350 can receive a reference voltage 302 to compare with a second sampled power supply 372. When the comparison reveals that the second sampled power supply 372 drops below the reference voltage 302, the voltage monitoring device 350 can generate the brownout indication signal 325 to indicate the power supply 301 may be undergoing or will undergo a brownout event.

The mode control device 340 can receive the reference voltage 302 to compare with a first sampled power supply 374. The mode control device 340 can set an operational mode of the voltage monitoring device 350 based on the comparison of the reference voltage 302 and the first sampled power supply 374. The operational mode can set or adjust a temporal response of the voltage monitoring device 350 to detect a change in the second sampled power supply 372.

The low voltage detection system shown in FIG. 3C can include a power supply sampling device 370 to provide the first sampled power supply 374 and the second sampled power supply 372. The first sampled power supply 374 and the second sampled power supply 372 can have different voltage levels. In some embodiments, the difference in the voltage levels of the first sampled power supply 374 and the second sampled power supply 372 can correspond to a difference in the first threshold level and the second threshold level. The power sampling device 370 can be a resistor ladder, for example, having multiple resistors coupled in series with the sampled power supplies 372 and 374 corresponding to voltage levels at different connection points between the multiple resistors.

Figure 3D:
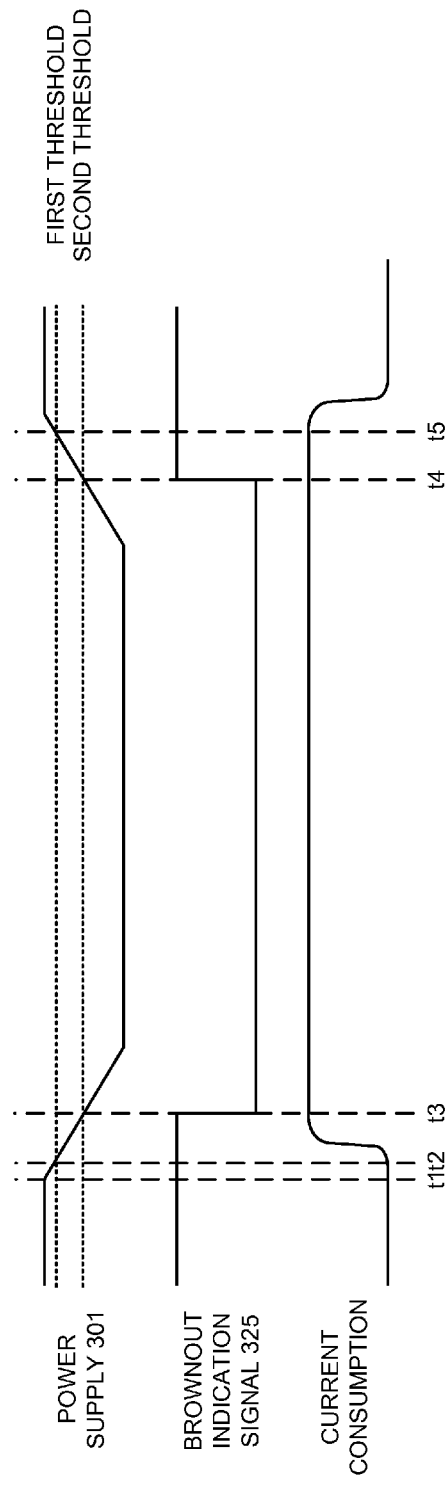

Referring to FIG. 3D, a timing diagram for the operation of the low voltage detection systems shown in FIGS. 3A-3C. At a time t1, the power supply 301 is shown at a high level, which can correspond to a normal operational voltage level. The brownout indication signal 325 generated by the voltage monitoring device 350 and the quantizer 320 is shown as being set to a high level, which can indicate no brownout event for the power supply 301. The current consumption by the voltage monitoring device 350 can be in a low level, for example, corresponding to a low power mode set by the mode control device 340.

At a time t2, the voltage level of the power supply 301 has dropped to meet a first threshold level, which can trigger the mode control device 340 to initiate a modification in the operational mode of the voltage monitoring device 350. For example, the mode control device 340 can prompt the adjustable current source 330 to increase a current utilized by the voltage monitoring device 350, which can decrease the response time of the voltage monitoring device 350 to changes in the power supply 301.

The brownout indication signal 325 generated by the voltage monitoring device 350 and the quantizer 320 can remain a high level, which can indicate no brownout event for the power supply 301. The current consumption by the voltage monitoring device 350 can increase with the modification of the operational mode of the voltage monitoring device 350.

At a time t3, the voltage level of the power supply 301 has dropped to meet a second threshold level, which can trigger the voltage monitoring device 350 to detect a brownout event and generate the brownout indication signal 325, which can indicate a presence of a brownout event for the power supply 301. In some embodiments, the voltage monitoring device 350 and the quantizer 320 can set the brownout indication signal 325 to a low level, which can indicate the presence of a brownout event for the power supply 301. The current consumption by the voltage monitoring device 350 can be at a high level, for example, corresponding to a fast response mode set by the mode control device 340 at time t2.

At a time t4, the voltage level of the power supply 301 has risen to meet the second threshold level, which can trigger the voltage monitoring device 350 to detect a resolution to the brownout event and transition the brownout indication signal 325 to a high level, which can indicate no brownout event for the power supply 301. The current consumption by the voltage monitoring device 350 can remain at a high level, for example, corresponding to a fast response mode set by the mode control device 340 at time t2.

At a time t5, the voltage level of the power supply 301 has risen to meet the first threshold level, which can trigger the mode control device 340 to initiate a modification in the operational mode of the voltage monitoring device 350. For example, the mode control device 340 can prompt the adjustable current source 330 to decrease the current utilized by the voltage monitoring device 350, which can decrease current consumption of the low voltage detection system during times when the power supply 301 may not be undergoing a brownout event.

The brownout indication signal 325 generated by the voltage monitoring device 350 and the quantizer 320 can remain a high level, which can indicate no brownout event for the power supply 301. The current consumption by the voltage monitoring device 350 can start to transition to a low level, for example, corresponding to a low power mode set by the mode control device 340.

Figure 4A:
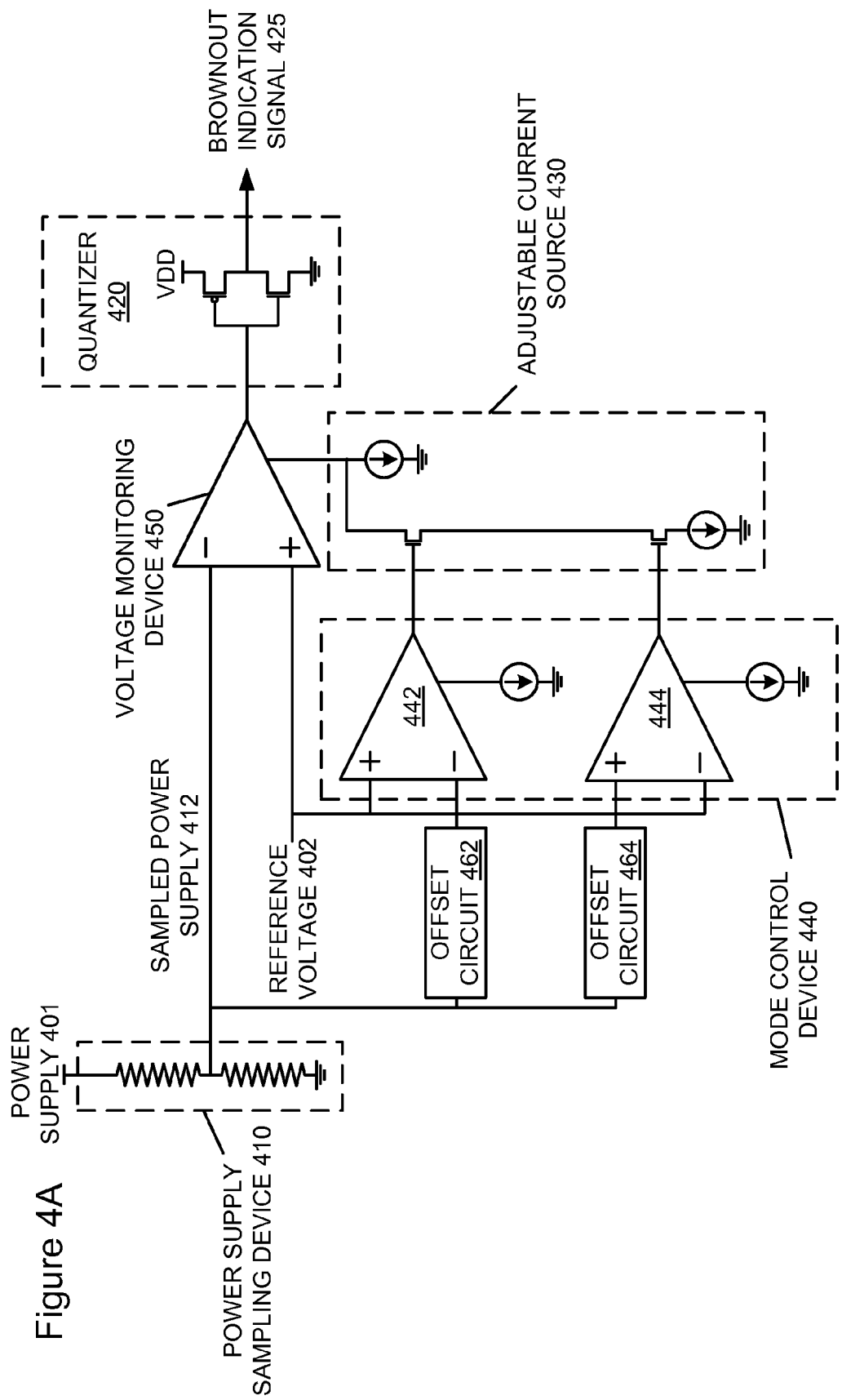
FIGS. 4A-4D are block diagram examples of the low voltage detection system.

FIGS. 4A-4D are block diagram examples of the low voltage detection system shown in FIG. 1. Referring to FIG. 4A, a low voltage detection system can include a voltage monitoring device 450 to detect brownout events and issue a brownout indication signal 425 in response to the brownout events. The voltage monitoring device 450 can output the brownout indication signal 425 to an electronic device, for example, as a reset signal, which can prompt the electronic device to preserve data, such as logic states and values in retention registers that may be affected by the brownout event.

The low voltage detection system can include a power sampling device 410 to sample a power supply 401 to generate a sampled power supply 412. The power sampling device 410 can be a resistor ladder, for example, having multiple resistors coupled in series. In some embodiments, the sampled power supply 412 can correspond to a voltage level at a connection point between the multiple resistors.

The low voltage detection system can include an adjustable current source 430 to power the voltage monitoring device 450. The magnitude of the current through the voltage monitoring device 450 can control a temporal response of the voltage monitoring device 450 to the onset of a brownout event. For example, the higher the current generated by the adjustable current source 430, the faster the temporal response to the onset of the brownout event by the voltage monitoring device 450.

The low voltage detection system can include a mode control device 440 to control a magnitude of the current generated by the adjustable current source 430. Since the magnitude of the current generated by the adjustable current source 430 corresponds to the temporal response of the voltage monitoring device 450, the mode control device 440 can control the voltage monitoring device 450 through the control of the adjustable current source 430.

The mode control device 440 can include a pair of comparators 442 and 444 and corresponding offset circuits 462 and 464, respectively, to detect when the power supply 401 drops below or rises above different threshold values. The different threshold values can correspond to different voltage levels of the power supply 401, which can prompt the mode control device 440 to direct a transition in an operational mode for the voltage monitoring device 450. For example, the mode control device 440 can transition the voltage monitoring device 450 to from a low power mode to a fast response mode when the power supply 401 drops below a first threshold voltage level as determined by comparator 442. The mode control device 440 can transition the voltage monitoring device 450 from a fast response mode to a low power mode, for example, after a brown event has been detected by the voltage monitoring device 450. In some embodiments, the transition of the voltage monitoring device 450 from a fast response mode to a low power mode can occur while the power supply 401 is undergoing a brownout event, for example, when the power supply 401 drops below a third threshold voltage level as determined by the comparator 444.

The offset circuits 462 and 464 can adjust a sampled power supply 412 so that the difference between the reference voltage 402 and adjusted versions of the sampled power supply 412 allow the corresponding comparators 442 and 444 to implement the first and third threshold voltage levels, respectively.

The voltage monitoring device 450 can detect a drop in a voltage level of the sampled power supply 412, which can indicate an onset of a brownout event. The voltage monitoring device 450 can generate the brownout indication signal 425, for example, after the power supply 401 drops below the second threshold voltage level. In some embodiments, the voltage monitoring device 450 can include a comparator to compare the sampled power supply 412 with the reference voltage 402, and generate the brownout indication signal 425 based on the comparison of the sampled power supply 412 and the reference voltage 402.

The low voltage detection system can include a quantizer 420 to convert the brownout indication signal into a discrete-voltage signal, which can output the brownout indication signal 425, for example, as a reset signal with a high state and a low state. In some embodiments, the quantizer 420 can include a complementary metal-oxide-semiconductor (CMOS) logic circuit including a PMOS transistor having a common gate and a common drain with an NMOS transistor. The common drain of the transistors can correspond to an output for the brownout indication signal 425.

Figure 4B:
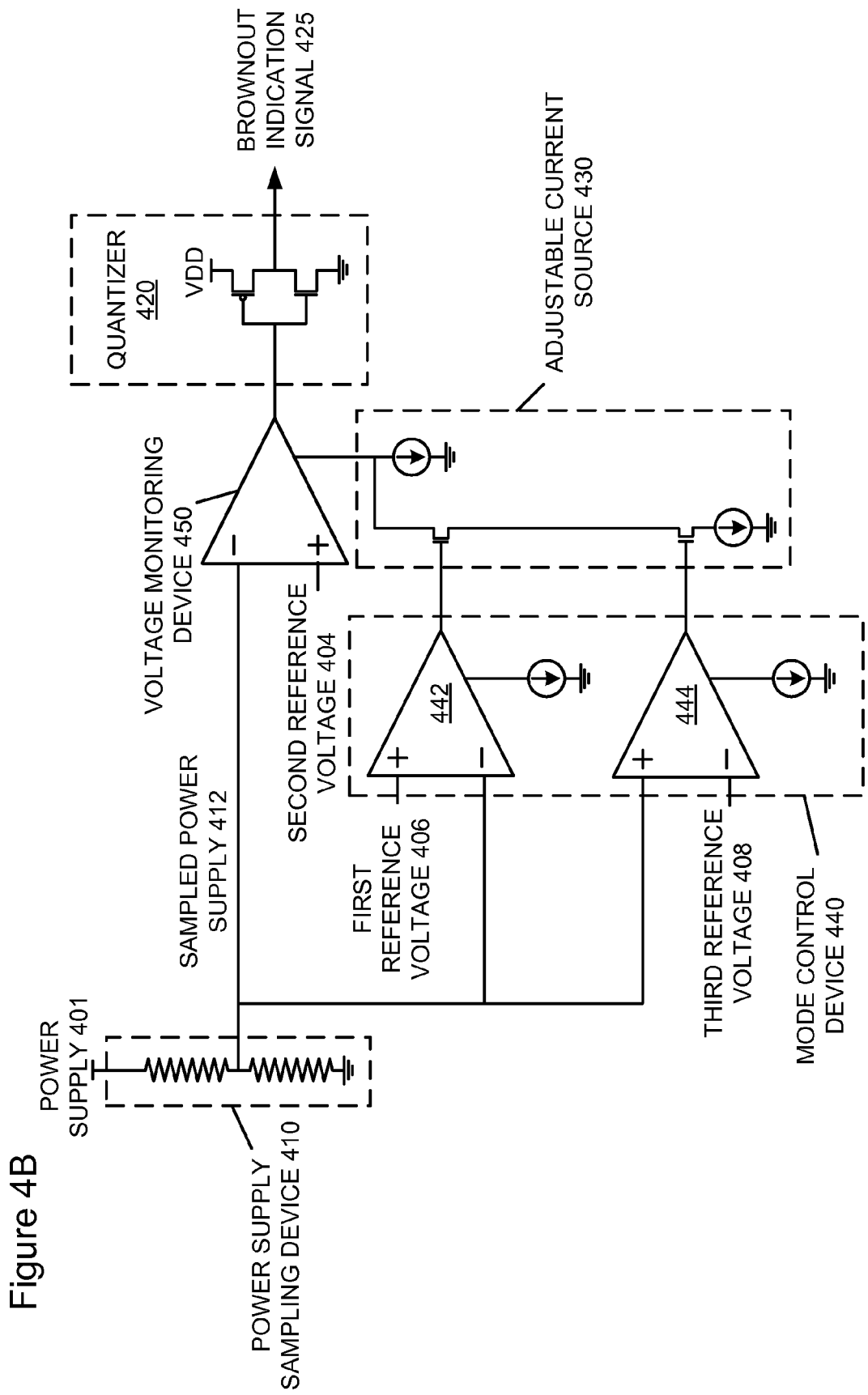

Referring to FIG. 4B, the low voltage detection system shown in FIG. 4B can be similar to the low voltage detection system shown in FIG. 4A and described above, with the following differences. The low voltage detection system shown in FIG. 4B can be configured to allow the mode control device 440 to detect when the power supply 401 reaches or exceeds the first threshold voltage level and a third threshold based on different reference voltages. The low voltage detection system shown in FIG. 4B can be configured to allow the voltage monitoring device 450 to detect when the power supply 401 reaches or exceeds the second threshold voltage level based on different reference voltages. The voltage monitoring device 450 can receive a second reference voltage 404 to compare with the sampled power supply 412. When the comparison reveals that the sampled power supply 412 drops below the second reference voltage 404, the voltage monitoring device 450 can generate the brownout indication signal 425 to indicate the power supply 401 may be undergoing or will undergo a brownout event.

The mode control device 440 can receive a first reference voltage 406 and a third reference voltage 408 to compare with the sampled power supply 412. The mode control device 440 can set an operational mode of the voltage monitoring device 450 based on the comparison of the first reference voltage 406 with the sampled power supply 412, and with the comparison of the third reference voltage 408 with the sampled power supply 412. The operational mode can set or adjust a temporal response of the voltage monitoring device 450 to a change in the sampled power supply 412.

Figure 4C:
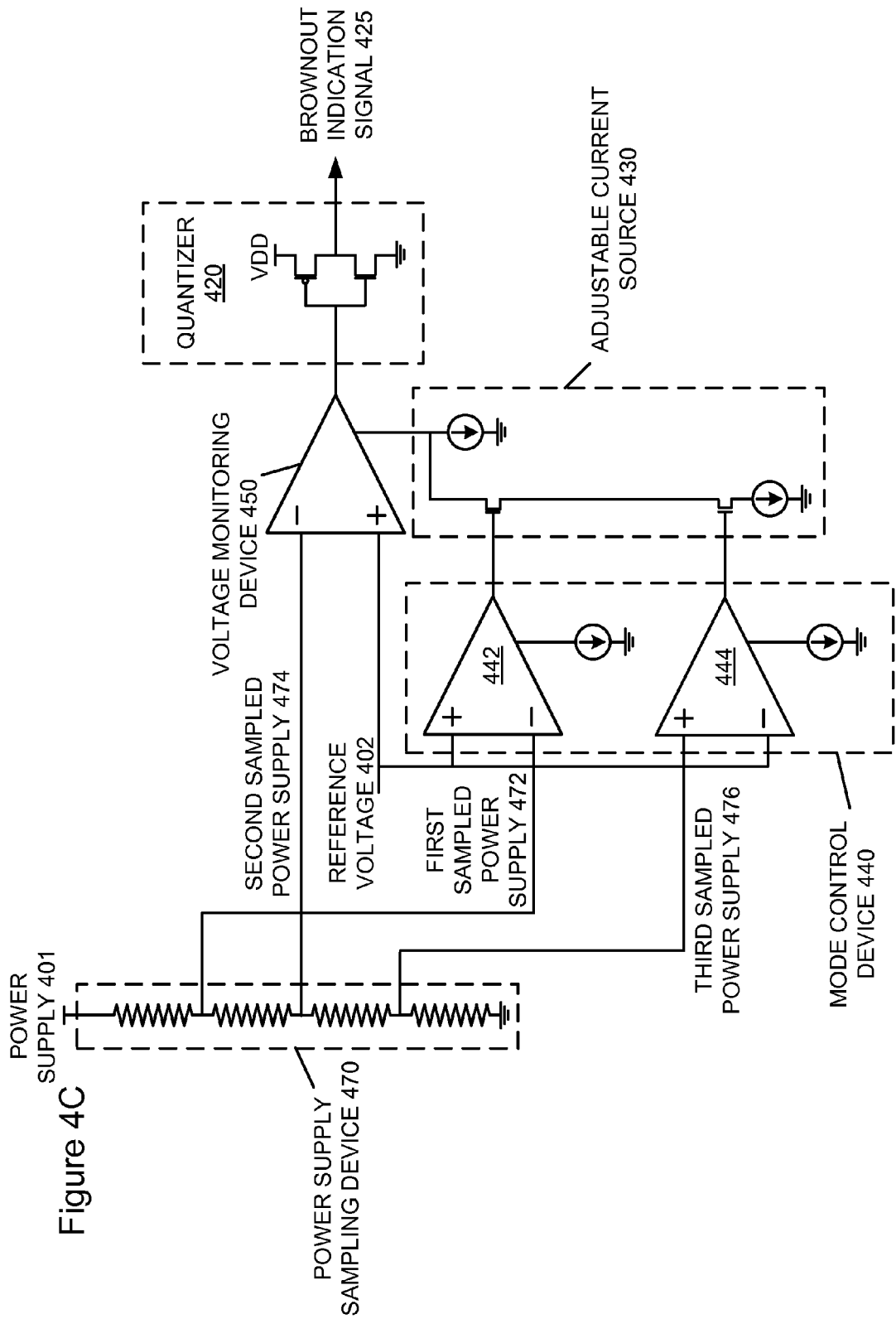

Referring to FIG. 4C, the low voltage detection system shown in FIG. 4C can be similar to the low voltage detection system shown in FIGS. 4A-4B and described above, with the following differences. The low voltage detection system shown in FIG. 4C can be configured to allow the mode control device 440 to detect when the power supply 401 reaches or exceeds the first threshold voltage level and a third threshold based on different sampled power supplies. The low voltage detection system shown in FIG. 4C can be configured to allow the voltage monitoring device 450 to detect when the power supply 401 reaches or exceeds the second threshold voltage level based on different sampled power supplies. The voltage monitoring device 450 can receive a reference voltage 402 to compare with a second sampled power supply 474. When the comparison reveals that the second sampled power supply 474 drops below the reference voltage 402, the voltage monitoring device 450 can generate the brownout indication signal 425 to indicate the power supply 401 may be undergoing or will undergo a brownout event.

The mode control device 440 can receive the reference voltage 402 to compare with a first sampled power supply 472 and a third sampled power supply 476. The mode control device 440 can set an operational mode of the voltage monitoring device 450 based on the comparison of the reference voltage 402 with the first sampled power supply 472 and the third sampled power supply 476. The operational mode can set or adjust a temporal response of the voltage monitoring device 450 to a change in the second sampled power supply 474.

The low voltage detection system shown in FIG. 4C can include a power supply sampling device 470 to provide the first sampled power supply 472, the second sampled power supply 474, and the third sampled power supply 476. The first sampled power supply 472, the second sampled power supply 474, and the third sampled power supply 476 can have different voltage levels. In some embodiments, the difference in the voltage levels of the first sampled power supply 472, the second sampled power supply 474, the third sampled power supply 476 can correspond to differences between the first threshold voltage level, the second threshold voltage level, and the third threshold voltage level. The power sampling device 470 can be a resistor ladder, for example, having multiple resistors coupled in series with the sampled power supplies 472, 474, and 476 corresponding to voltage levels at different connection points between the multiple resistors.

Figure 4D:
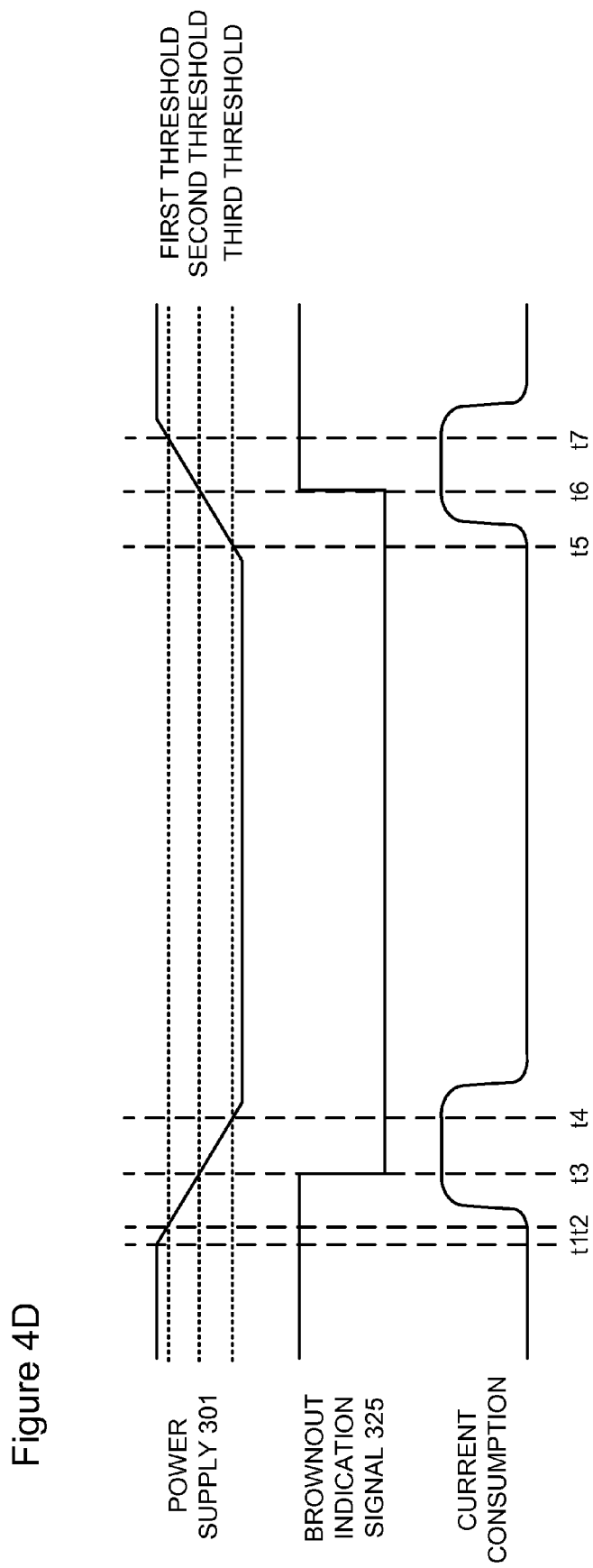

Referring to FIG. 4D, a timing diagram for the operation of the low voltage detection systems shown in FIGS. 4A-4C. At a time t1, the power supply 401 is shown at a high level, which can correspond to a normal operational voltage level. The brownout indication signal 425 generated by the voltage monitoring device 450 and the quantizer 420 is shown as being set to a high level, which can indicate no brownout event for the power supply 401. The current consumption by the voltage monitoring device 450 can be in a low level, for example, corresponding to a low power mode set by the mode control device 440.

At a time t2, the voltage level of the power supply 401 has dropped to meet a first threshold level, which can trigger the mode control device 440 to initiate a modification in the operational mode of the voltage monitoring device 450. For example, the mode control device 340 can prompt the adjustable current source 430 to increase a current utilized by the voltage monitoring device 450, which can decrease the response time of the voltage monitoring device 450 to changes in the power supply 401.

The brownout indication signal 425 generated by the voltage monitoring device 450 and the quantizer 420 can remain a high level, which can indicate no brownout event for the power supply 401. The current consumption by the voltage monitoring device 450 can increase based on the modification to the operational mode of the voltage monitoring device 450.

At a time t3, the voltage level of the power supply 401 has dropped to meet a second threshold level, which can trigger the voltage monitoring device 450 to detect a brownout event and generate the brownout indication signal 425, which can indicate a presence of a brownout event for the power supply 401. In some embodiments, the voltage monitoring device 450 and the quantizer 420 can set the brownout indication signal 425 to a low level, which can indicate the presence of a brownout event for the power supply 401. The current consumption by the voltage monitoring device 450 can be at a high level, for example, corresponding to a fast response mode set by the mode control device 440 at time t2.

At a time t4, the voltage level of the power supply 401 has dropped to meet a third threshold level, which can trigger the mode control device 440 to initiate a modification in the operational mode of the voltage monitoring device 450. This operational mode change can transition the voltage monitoring device 450 from a fast response mode to a low power mode during the brownout event and after the voltage monitoring device 450 has detected the brownout event in the fast response mode. For example, the mode control device 440 can prompt the adjustable current source 430 to decrease the current utilized by the voltage monitoring device 450, which can decrease current consumption of the low voltage detection system.

The brownout indication signal 425 generated by the voltage monitoring device 450 and the quantizer 420 can remain at a low level, which can indicate a brownout event for the power supply 401. The current consumption by the voltage monitoring device 450 can start to transition to a low level, for example, corresponding to the low power mode set by the mode control device 440.

At a time t5, the voltage level of the power supply 401 has risen to meet the third threshold level, which can trigger the mode control device 440 to initiate a modification in the operational mode of the voltage monitoring device 450. This operational mode change can transition the voltage monitoring device 450 from a low power mode to a fast response mode as the power supply 401 appears to begin recovering from the brownout event. For example, the mode control device 440 can prompt the adjustable current source 430 to increase the current utilized by the voltage monitoring device 450.

The brownout indication signal 425 generated by the voltage monitoring device 450 and the quantizer 420 can remain at a low level, which can indicate a brownout event for the power supply 401. The current consumption by the voltage monitoring device 450 can start to transition to a high level, for example, corresponding to the fast response mode set by the mode control device 440.

At a time t6, the voltage level of the power supply 401 has risen to meet the second threshold level, which can trigger the voltage monitoring device 450 to detect a resolution to the brownout event and transition the brownout indication signal 425 to a high level indicating no brownout event for the power supply 401. The current consumption by the voltage monitoring device 450 can be at a high level, for example, corresponding to a fast response mode set by the mode control device 440 at time t5.

At a time t7, the voltage level of the power supply 401 has risen to meet the first threshold level, which can trigger the mode control device 440 to initiate a modification in the operational mode of the voltage monitoring device 450. For example, the mode control device 440 can prompt the adjustable current source 430 to decrease the current utilized by the voltage monitoring device 450, which can decrease current consumption of the low voltage detection system during times when the power supply 401 may not be undergoing a brownout event.

The brownout indication signal 425 generated by the voltage monitoring device 450 and the quantizer 420 can remain a high level, which can indicate no brownout event for the power supply 401. The current consumption by the voltage monitoring device 450 can start to transition to a low level, for example, corresponding to a low power mode set by the mode control device 440.

Figure 5A:
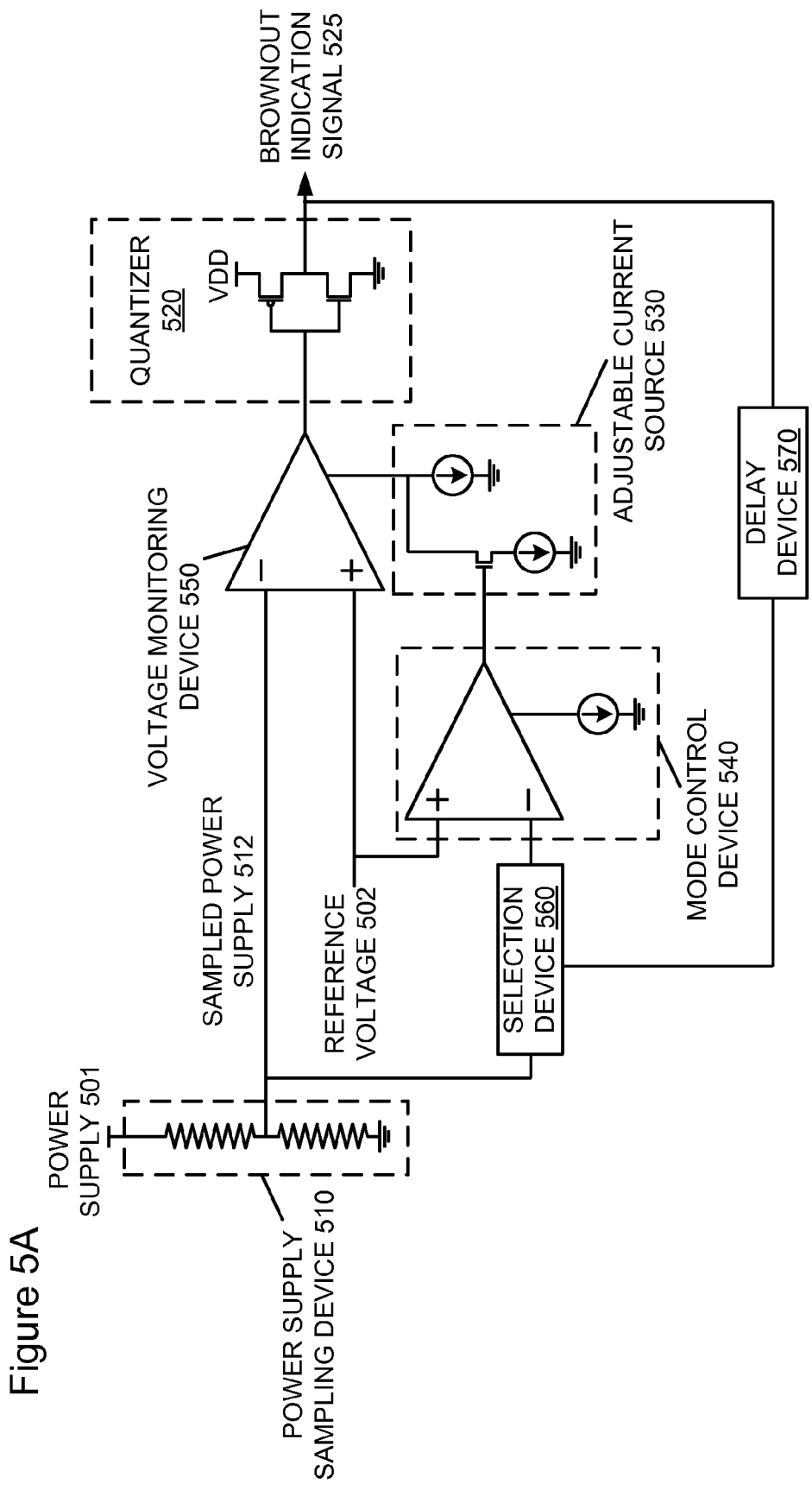
FIGS. 5A-5B are block diagram examples of the low voltage detection system.
Figure 5B:
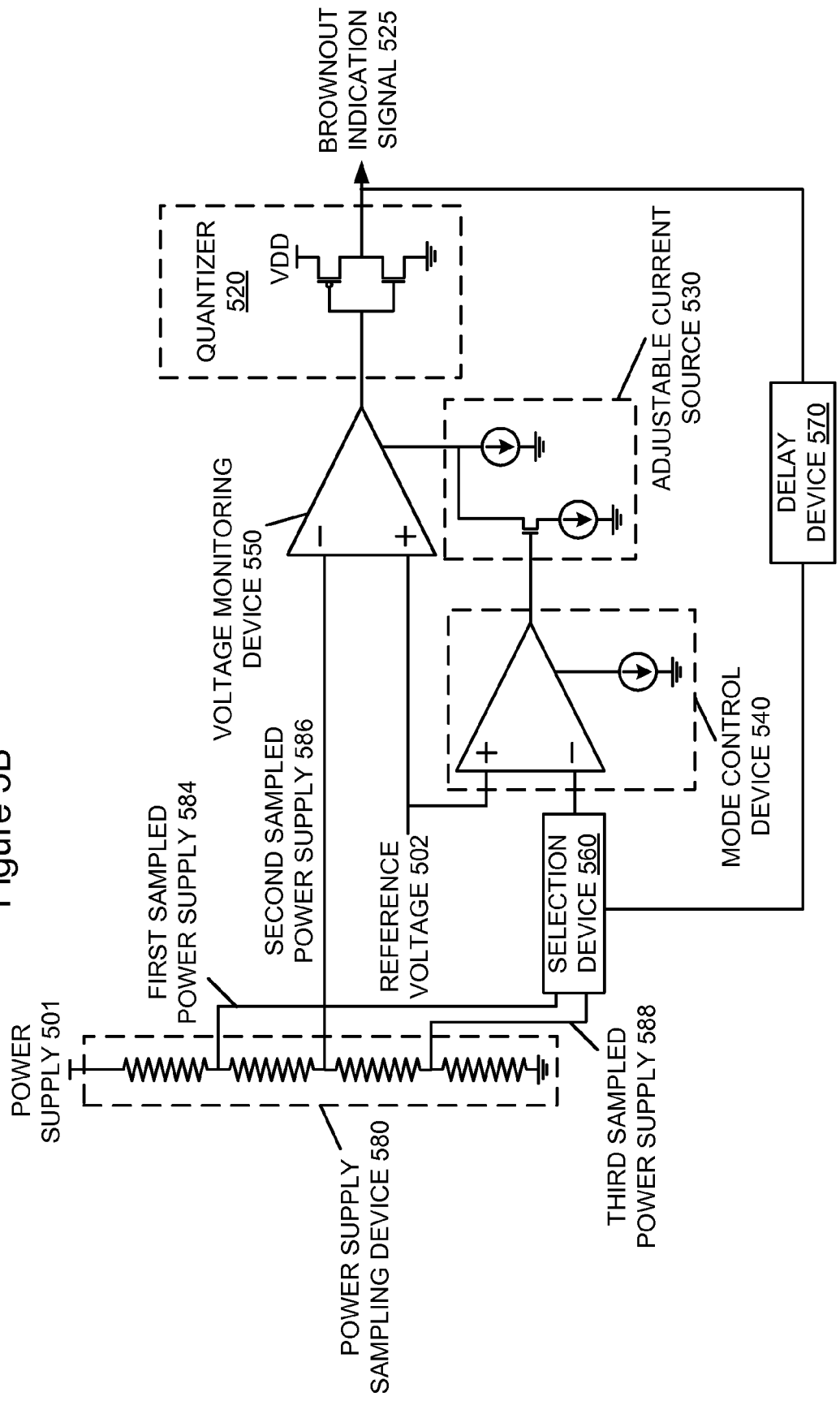

FIGS. 5A-5B are block diagram examples of the low voltage detection system shown in FIG. 1. Referring to FIG. 5A, a low voltage detection system can include a voltage monitoring device 550 to detect brownout events and issue a brownout indication signal 525 in response to the brownout events. The voltage monitoring device 550 can output the brownout indication signal 525 to an electronic device, for example, as a reset signal, which can prompt the electronic device to preserve data, such as logic states and values in retention registers that may be affected by the brownout event.

The low voltage detection system can include a power sampling device 510 to sample a power supply 501 to generate a sampled power supply 512. The power sampling device 510 can be a resistor ladder, for example, having multiple resistors coupled in series. In some embodiments, the sampled power supply 512 can correspond to a voltage level at a connection point between the multiple resistors.

The low voltage detection system can include an adjustable current source 530 to power the voltage monitoring device 550. The magnitude of the current through the voltage monitoring device 550 can control a temporal response of the voltage monitoring device 550 to the onset of a brownout event. For example, the higher the current generated by the adjustable current source 530, the faster the temporal response to the onset of the brownout event by the voltage monitoring device 550.

The low voltage detection system can include a mode control device 540 to control a magnitude of the current generated by the adjustable current source 530. Since the magnitude of the current generated by the adjustable current source 530 corresponds to the temporal response of the voltage monitoring device 550, the mode control device 540 can control the voltage monitoring device 550 through the control of the adjustable current source 530. The mode control device 540 can determine the magnitude of the current for the adjustable current source 530 to generate, for example, when the power supply 501 drops below a first threshold voltage level.

In some embodiments, the mode control device 540 can determine the power supply 501 drops below a first threshold voltage level based on the reference voltage 502 and a version of the sampled power supply 512 from a selection device 560. The selection device 560 can adjust a voltage magnitude of the sampled power supply 512 and provide the adjusted version of the sampled power supply 512 to the mode control device 540. The selection device 560 can adjust the voltage magnitude of the sampled power supply 512 based on the brownout indication signal 525. Since a feedback of the brownout indication signal 525 can implement a closed-loop configuration for the low voltage detection system, the low voltage detection system can include a delay device 570 to delay a reception of the brownout indication signal 525 by the selection device 560, for example, to help ensure stability of the low voltage detection system.

The voltage monitoring device 550 can detect a drop in a voltage level of the sampled power supply 512, which can indicate an onset of a brownout event. The voltage monitoring device 550 can generate the brownout indication signal 525, for example, after the power supply 501 drops below a second threshold voltage level. In some embodiments, the voltage monitoring device 550 can include a comparator to compare the sampled power supply 512 with the reference voltage 502, and generate the brownout indication signal 525 based on the comparison of the sampled power supply 512 and the reference voltage 502.

The low voltage detection system can include a quantizer 520 to convert the brownout indication signal into a discrete-voltage signal, which can output the brownout indication signal 525, for example, as a reset signal with a high state and a low state. In some embodiments, the quantizer 520 can include a complementary metal-oxide-semiconductor (CMOS) logic circuit including a PMOS transistor having a common gate and a common drain with an NMOS transistor. The common drain of the transistors can correspond to an output for the brownout indication signal 525.

The selection device 560 can adjust the sampled power supply 512 based on the brownout indication signal 525, for example, to allow for a third threshold voltage level to be implemented by the mode control device 540. In some examples, the third threshold voltage level in the low voltage detection system of FIG. 5A can be similar to the third threshold voltage level discuss above with respect to FIGS. 4A-4D. When the power supply 501 drops below the third threshold voltage level, the mode control device 540 can transition the voltage monitoring device 550 to a low power state during a brownout event after the voltage monitoring device 550 has detected the brownout event in a fast response state as indicated by the brownout detection signal 525.

Referring to FIG. 5B, the low voltage detection system shown in FIG. 5B can be similar to the low voltage detection system shown in FIG. 5A and described above, with the following differences. The low voltage detection system shown in FIG. 5B can be configured to allow the mode control device 540 to detect when the power supply 501 reaches or exceeds the first threshold voltage level and a third threshold based on different sampled power supplies. The low voltage detection system shown in FIG. 5B can be configured to allow the voltage monitoring device 550 to detect when the power supply 501 reaches or exceeds the second threshold voltage level based on different sampled power supplies. The voltage monitoring device 550 can receive a reference voltage 502 to compare with a second sampled power supply 586. When the comparison reveals that the second sampled power supply 586 drops below the reference voltage 502, the voltage monitoring device 550 can generate the brownout indication signal 525 to indicate the power supply 501 may be undergoing or will undergo a brownout event.

The mode control device 540 can receive the reference voltage 502 to compare with a voltage output from a selection device 560. The selection device 560 can receive the first sampled power supply 584 and the third sampled power supply 588, and select between them based on the brownout indication signal 525. Since a feedback of the brownout indication signal 525 can implement a closed-loop configuration for the low voltage detection system, the low voltage detection system can include a delay device 580 to delay a reception of the brownout indication signal 525 by the selection device 560, for example, to help ensure stability of the low voltage detection system.

The mode control device 540 can set an operational mode of the voltage monitoring device 550 based on the comparison of the reference voltage 502 and voltage output from the selection device 560. The operational mode can set or adjust a temporal response of the voltage monitoring device 550 to a change in the power supply 501. When the selection device 560 selects the first sampled power supply 584, for example, in response to the brownout indication signal 525 being at a high level indicating that there is no current brownout event, the mode control device 540 can prompt the voltage monitoring device 550 to transition to a fast response state when the power supply 501 drops below the first threshold voltage level.

When the selection device 560 selects the third sampled power supply 588, for example, in response to the brownout indication signal 525 being at a low level indicating that there is a current brownout event, the mode control device 540 can prompt the voltage monitoring device 550 to transition to a low power state when the power supply 501 drops below the third threshold voltage level. In some examples, the third threshold voltage level in the low voltage detection system of FIG. 5B can be similar to the third threshold voltage level discuss above with respect to FIGS. 4A-4D. The mode control device 540 can transition the voltage monitoring device 550 to a low power state during a brownout event after the voltage monitoring device 550 has detected the brownout event in a fast response state as indicated by the brownout detection signal 525.

The low voltage detection system shown in FIG. 5B can include a power supply sampling device 580 to provide the first sampled power supply 584, the second sampled power supply 586, and the third sampled power supply 588. The first sampled power supply 584, the second sampled power supply 586, and the third sampled power supply 588 can have different voltage levels. In some embodiments, the difference in the voltage levels of the first sampled power supply 584, the second sampled power supply 586, and the third sampled power supply 588 can correspond to differences in the first threshold voltage level, the second threshold voltage level, and the third threshold voltage level. The power sampling device 580 can be a resistor ladder, for example, having multiple resistors coupled in series with the sampled power supplies 584, 586, and 588 corresponding to voltage levels at different connection points between the multiple resistors.

Figure 6:
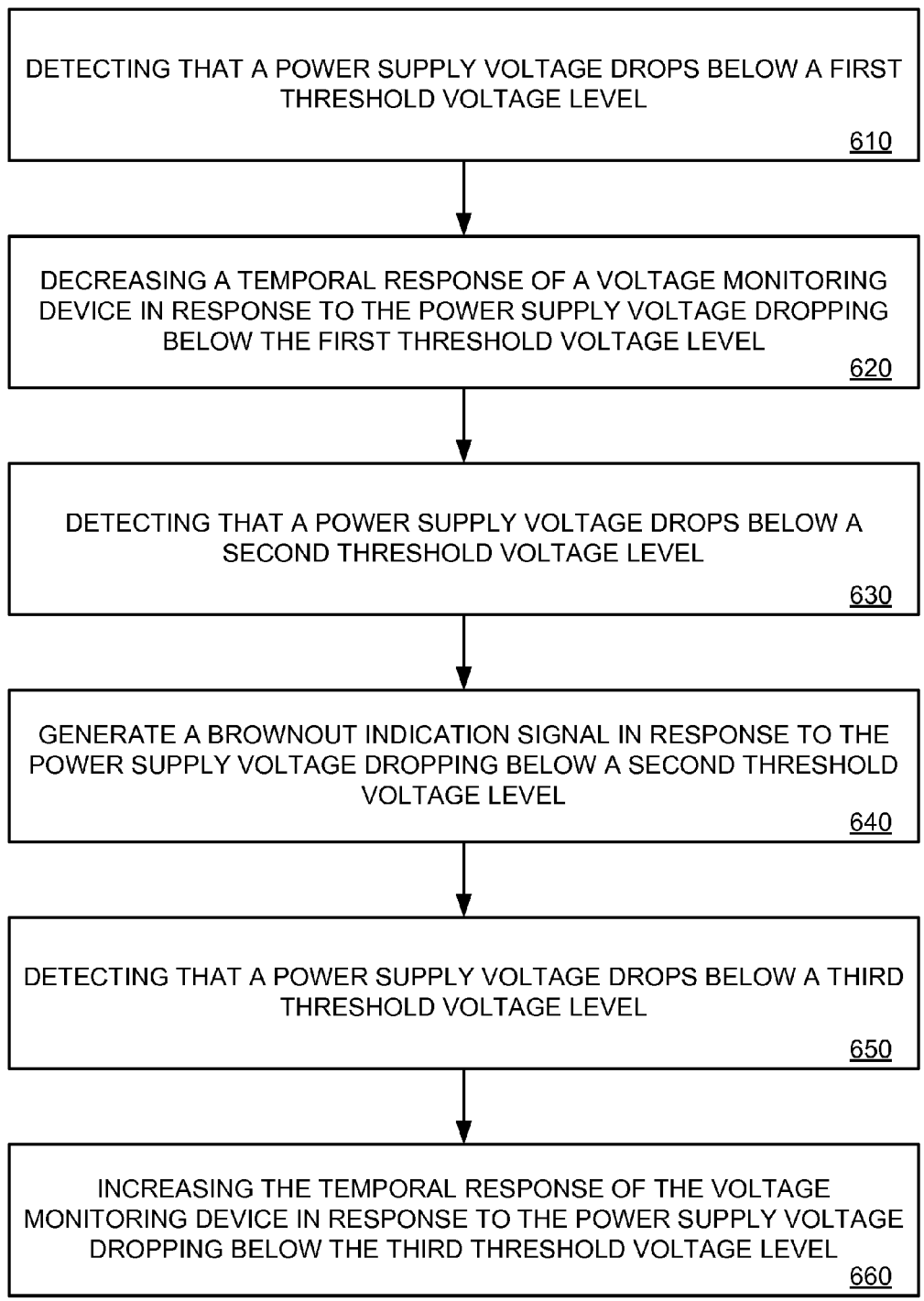
FIG. 6 is an example operational flowchart for the operation of the low voltage detection system.

FIG. 6 is an example operational flowchart for the operation of the low voltage detection system. Referring to FIG. 6, in a block 610, a low voltage detection system can detect a power supply voltage drops below a first threshold voltage level. The low voltage detection system can include a mode control device configured to monitor the power supply, for example, through a sampled version of the power supply, to determine when the power supply reaches or exceeds the first threshold.

In a block 620, the low voltage detection system can decrease a temporal response of a voltage monitoring device in response to the power supply voltage dropping below the first threshold voltage level. In some embodiments, the mode control device can decrease the temporal response of the voltage monitoring device by increasing a current utilized to power the voltage monitoring device.

In a block 630, the low voltage detection system can detect the power supply voltage drops below a second threshold voltage level. In a block 640, the low voltage detection system can generate a brownout indication signal in response the power supply voltage dropping below a second threshold voltage level. The brownout indication signal can indicate to an electronic system that the power supply may be undergoing or will potentially undergo a brownout event.

In a block 650, the low voltage detection system can detect a power supply voltage drops below a third threshold voltage level. In a block 660, the low voltage detection system can increase the temporal response of the voltage monitoring device in response to the power supply voltage dropping below the third threshold voltage level. In some embodiments, the mode control device can increase the temporal response of the voltage monitoring device by decreasing a current utilized to power the voltage monitoring device.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

One of skill in the art will recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

What is claimed is:

1. An apparatus comprising:
   a voltage monitoring device to generate a brownout indication; and
   a mode control device configured to receive a sampled power supply voltage, and further configured to adjust a temporal response of the voltage monitoring device from a first mode to a second mode in response to the sampled power supply voltage dropping below a first threshold voltage level, the temporal response being a response time of the voltage monitoring device to a change in the power supply voltage, wherein the voltage monitoring device has a faster temporal response in the second mode as compared to the first mode, and wherein the voltage monitoring device is configured to generate the brownout indication signal based on the mode of the voltage monitoring device and in response to sampled power supply voltage dropping below a second threshold voltage level.

2. The apparatus of claim 1, wherein the mode control device is configured to set the voltage monitoring device in the first mode when the voltage level of the power supply voltage is above the first threshold voltage level.

3. The apparatus of claim 2, wherein the voltage monitoring device is configured to have a lower power consumption in the first mode as compared to the second mode.

4. The apparatus of claim 1, wherein the voltage monitoring device includes a comparator to compare a sampled version of the power supply voltage to a reference voltage, and generate the brownout indication signal in response to the comparison.

5. The apparatus of claim 1, further comprising an adjustable current source to generate current for the voltage monitoring device, wherein a magnitude of the current corresponds to the temporal response of the voltage monitoring device to the change in the power supply voltage.

6. The apparatus of claim 5, wherein the mode control device is configured to prompt the adjustable current source to adjust the magnitude of the current for the voltage monitoring device based on the voltage level of the power supply voltage.

7. A method comprising:
   receiving, at a mode control device, a sampled power supply voltage representative of a power supply voltage level;
   detecting, with the mode control device, that the sampled power supply voltage drops below a first threshold voltage level; and
   adjusting, with the mode control device, a temporal response of a voltage monitoring device from a first mode to a second mode in response to the sampled power supply voltage dropping below the first threshold voltage level, wherein the temporal response is a response time of the voltage monitoring device to a change in the power supply voltage, wherein the voltage monitoring device has a faster temporal response in the second mode as compared to the first mode, and wherein the voltage monitoring device generates a brownout indication signal in response to the sampled power supply voltage dropping below a second threshold voltage level.

8. The method of claim 7, wherein adjusting the temporal response of the voltage monitoring device further comprises prompting, with the mode control device, an adjustable current source to increase a magnitude of current for the voltage monitoring device in response to the power supply voltage dropping below the first threshold voltage level.

9. The method of claim 8, wherein the magnitude of the current for the voltage monitoring device corresponds to a magnitude of the temporal response of the voltage monitoring device to the change in the power supply voltage.

10. The method of claim 7, wherein adjusting the temporal response of the voltage monitoring device further comprises changing a setting of the voltage monitoring device.

11. The method of claim 10, wherein the voltage monitoring device has a lower power consumption in the first mode as compared to the second mode.

12. An apparatus comprising:
   a first comparator configured to monitor a sampled power supply voltage representative of a voltage level of a power supply; and
   a second comparator configured to set an operational mode and a response time of the first comparator based on the sampled power supply voltage, wherein the second comparator is configured to adjust the operational mode from a first mode to a second mode in response to the sampled power supply voltage dropping below a first threshold voltage level, wherein the first comparator has a faster temporal response in the second mode as compared to the first mode, wherein the first comparator is configured to generate a brownout indication signal based on the operational mode of the first comparator, and in response to sampled power supply voltage dropping below a second threshold voltage level.

13. The apparatus of claim 12, wherein the operational mode of the first comparator is configured to determine a temporal response of the first comparator to a change in the voltage level of power supply.

14. The apparatus of claim 12, wherein the second comparator is configured to detect the voltage level of the power supply drops below the first threshold voltage level.

15. The apparatus of claim 14, further comprising a selection device to adjust the first threshold voltage level based, at least in part, on the brownout selection signal, wherein the second comparator is configured to set the operational mode of the first comparator based on the first threshold voltage level adjusted based, at least in part, on the brownout selection signal.

16. The apparatus of claim 12, further comprising a third comparator to operate in combination with the second comparator to set the operational mode of the first comparator based, at least in part, on the voltage level of the power supply.

* * * * *